(12) United States Patent
Mathur

(10) Patent No.: US 10,616,679 B2
(45) Date of Patent: Apr. 7, 2020

(54) PASSIVE ACOUSTIC META MATERIAL AUDIO AMPLIFIER AND THE METHOD TO MAKE THE SAME

(71) Applicant: Acoustic Metamaterials LLC, Scarsdale, NY (US)

(72) Inventor: Gopal P. Mathur, Trabuco Canyon, CA (US)

(73) Assignee: ACOUSTIC METAMATERIALS LLC, Scarsdale, NY (US)

( * ) Notice: Subject to any disclaimer, the term of this patent is extended or adjusted under 35 U.S.C. 154(b) by 0 days.

(21) Appl. No.: 16/416,605

(22) Filed: May 20, 2019

(65) Prior Publication Data

US 2020/0037064 A1    Jan. 30, 2020

Related U.S. Application Data

(63) Continuation-in-part of application No. 16/046,457, filed on Jul. 26, 2018, now abandoned.

(51) Int. Cl.
*H04R 1/28* (2006.01)
*H04R 1/34* (2006.01)
*H03F 3/181* (2006.01)

(52) U.S. Cl.
CPC .......... *H04R 1/2834* (2013.01); *H03F 3/181* (2013.01); *H04R 1/2888* (2013.01); *H04R 1/345* (2013.01)

(58) Field of Classification Search
CPC ...... H04R 1/2857; H04R 1/025; H04R 1/345; H04R 1/30; H04R 1/44; H04R 1/46; H04R 1/023; G10K 11/02; G10K 9/00
See application file for complete search history.

(56) References Cited

U.S. PATENT DOCUMENTS

| | | | |
|---|---|---|---|
| 5,524,062 A * | 6/1996 | Oh ...................... | H04R 1/2842 381/338 |
| 2017/0069303 A1* | 3/2017 | Song ..................... | H04R 1/345 |

\* cited by examiner

*Primary Examiner* — Sunita Joshi
(74) *Attorney, Agent, or Firm* — Michael J. Feigin, Esq.; Feigin and Fridman LLC

(57) ABSTRACT

An Acoustic meta material (AMM) device for passive amplification of sound is described. The AMM amplifier device employs a deep sub-wavelength resonator design with high refraction index, which uses resonant amplification of the bass sound. An array of sub wavelength, single frequency channels are used, each resonating and amplifying at a different frequency in the bass frequency range. This is accomplished by having many different channels, each with an opening extending in a same, common, or substantially common direction. Thus, sound emanating from a speaker in a first direction continues in this direction until reaching and entering the openings of the plurality of channels. The sound from the speaker is in all transmitted frequencies of, for example, a musical recording or the like. However, only a specific frequency and/or harmonics thereof are substantially propagated through each channel.

6 Claims, 8 Drawing Sheets

Figure 7

| No. | Musical Note | Frequency, Hz | N: Number of sub-channels | Wavelength: λ/4 (m) |
|---|---|---|---|---|
| 1 | C/B# | 32.703 | 868.93 | 2.629 |
| 2 | D | 36.708 | 774.126 | 2.343 |
| 3 | E/Fb | 41.203 | 689.673 | 2.087 |
| 4 | F/E# | 43.654 | 650.951 | 1.970 |
| 5 | G | 48.999 | 579.942 | 1.755 |
| 6 | A | 55.00 | 516.665 | 1.564 |
| 7 | B/Cb | 61.735 | 460.30 | 1.393 |
| 8 | C#/Db | 34.648 | 820.151 | 2.482 |
| 9 | D#/Eb | 38.890 | 730.692 | 2.211 |
| 10 | F#/Gb | 46.249 | 614.426 | 1.859 |
| 11 | G#/Ab | 51.913 | 547.389 | 1.657 |
| 12 | A#/Bb | 58.271 | 487.663 | 1.476 |

# PASSIVE ACOUSTIC META MATERIAL AUDIO AMPLIFIER AND THE METHOD TO MAKE THE SAME

FIELD OF THE DISCLOSED TECHNOLOGY

The present disclosure relates generally to passive amplification of acoustic sound and more specifically to amplification of bass sound of loudspeakers and other devices in the low frequency region using acoustic meta material devices.

BACKGROUND OF THE DISCLOSED TECHNOLOGY

Loudspeakers are integral/critical parts of all audio systems. However, loudspeakers are known as the weakest link in any sound reproduction scheme. Ideally, it should create a sound field proportional to the electric signal of the amplifier. Due to the physics of sound radiation, this paradigm has not been achieved, particularly in the low frequency region (<300 Hz). The low efficiency of the loudspeaker generates more heat than sound power output while adding undesired distortion to the output signal. The frequency response of a conventional loudspeaker usually rolls off faster at low frequencies (<300 Hz). Consequently, most loudspeaker systems employ more than one driver; such as subwoofers (very low frequencies); woofers (low frequencies); mid-range speakers; tweeters; and sometimes super-tweeters, to adequately reproduce a wide range of frequencies with even coverage. Also, the production of a good high-fidelity loudspeaker has required that the speakers be enclosed in a ported box, which acts like a Helmholtz resonator.

Miniaturization and integration of acoustic devices have been an important consideration in recent times. Consumer electronic devices, such as cell phones, laptops, tablets, and the like with more features and capabilities are ubiquitous and are positioning to become audio entertainment centers. However, they also exhibit severe audio deficiencies and pose many additional challenges to maintain the acoustic performance as enclosed acoustic volume size, power and membrane size are reduced significantly. Due to the smaller size of the speaker used in such devices, the low frequency response is severely affected. For example, as the size of the cell (or mobile) phone decreases, the volume of air behind the diaphragm is reduced. This small amount of volume behind the speaker limits the range of motion of the diaphragm. The speaker does not produce enough force to compress the air beyond a certain point, hence causing the air to push back. This reduces the displacement of the speaker diaphragm, which in turn lowers the output. Thus, low frequencies are affected the most by this phenomenon as the diaphragm moves with the largest amount of displacement at these frequencies. Consequently, the frequency response usually rolls off faster at low frequencies, herein referred to as "bass frequencies" which are those which are audible or able to be sensed by a human and are below 300 Hertz.

Thus, what is needed is a way to accurately reproduce sound when wavelengths far exceed that of the available length to propagate a wave.

SUMMARY OF THE DISCLOSED TECHNOLOGY

An array of sub wavelength single frequency channels are used, each resonating and amplifying at a different frequency in the bass range. Thus, each is the length of an entire wavelength or a fraction thereof, such as ½ or ¼ of the wavelength so as to have a broad band passive (acoustic and non-electrical) amplification effect. This is accomplished by having many/a plurality of different channels, each with an opening extending in a same, common, or substantially common direction. Thus, sound emanating from a speaker in a first direction continues in this direction until reaching and entering the openings of the plurality of channels. The sound from the speaker is in all transmitted frequencies of, for example, a musical recording or the like. However, only a specific frequency and/or harmonics thereof are substantially propagated through each channel, as each channel is of a different length with resonates only a specific frequency or multiplier of a specific frequency. While, in the prior art, one might accomplish this through very long pipes, in the present technology, very thin, narrow and small "pipes" are used which zig-zag (extend one direction and then turn and extend an opposite direction repeatedly (defined as "at least 10 times")) and may even turn back upon themselves (zig-zag with the pipe/path/channel extending back towards the opening where sound entered the channel). In this manner, the channel can be as long as the wavelength desired, but over a much smaller space such as to fit, for example, on the back of a hand-held electronic device (an electronic device designed to be operated to hear/record sound while being held in a hand of a user thereof).

A conventional speaker, meaning a speaker which is designed to output sound to the human ear at a range of frequencies within and in some embodiments, outside of the bass range, such as a speaker built into a per-existing device (such as a phone or music player) outputs sound in a direction of a funnel, cone, or housing which directs the sound into/towards the openings of the channels. In some embodiments, the channel openings are simply situated in the path of the direction of sound emanating from the speaker.

The channels can be attached to a common back plate and/or be within a housing. Such a housing can be within an electronic device with cellular network connectivity (sending and receiving) such that a speaker of the electronic device transmits sound into the housing and each of the channels. Each channel amplifies it's respective frequency and/or harmonics thereof and the entire housing can fit or be attached to a single side of the electronic device, such as in a case thereof which is substantially a same length and width as the electronic device itself.

A majority of the individual frequency channels have a total length equal to, one half of, and/or one quarter of a musical note defined in the lower octave Helmholtz music notes/pitch notation system (defined as a named system for the Western chromatic scale used in Western music) in embodiments of the disclosed technology.

Each channel can have a different total length (the length of the path from opening, through the zig-zag pathway, to the exit) than each other. A different bass frequency and/or harmonic frequency thereof is amplified by each of the plurality of single frequency channels in embodiments of the disclosed technology.

In a method of use, one can align an opening into a plurality of single frequency channels towards a conventional loudspeaker, output sound through the conventional speaker substantially in a direction of each opening (directly or by way of curving/turning the sound there-towards through the use of a funnel or adapter which shapes the sound direction), and have the sound amplified at a different bass frequency in each channel. The length of each channel
} can be that of the wavelength it amplifies, ½ the wavelength, or ¼ the wavelength. In one example thereof, the length is exactly, ½ of, or ¼ of 2.629 meters in one channel and 1.393 meters in another channel.

The speaker used can be an internal speaker of an electronic device, such as a cellular phone which has cellular network connectivity, a display screen, a speaker, a microphone, and the like.

"Substantially" and "substantially shown," for purposes of this specification, are defined as "at least 90%," or as otherwise indicated. Any device may "comprise" or "consist of" the devices mentioned there-in, as limited by the claims.

It should be understood that the use of "and/or" is defined inclusively such that the term "a and/or b" should be read to include the sets: "a and b," "a or b," "a," "b."

BRIEF DESCRIPTION OF THE DRAWINGS

FIG. 7 shows a table of musical notes, number of sub-channels, and wavelength for various bass frequencies.

DETAILED DESCRIPTION OF EMBODIMENTS OF THE DISCLOSED TECHNOLOGY

Figure 1:
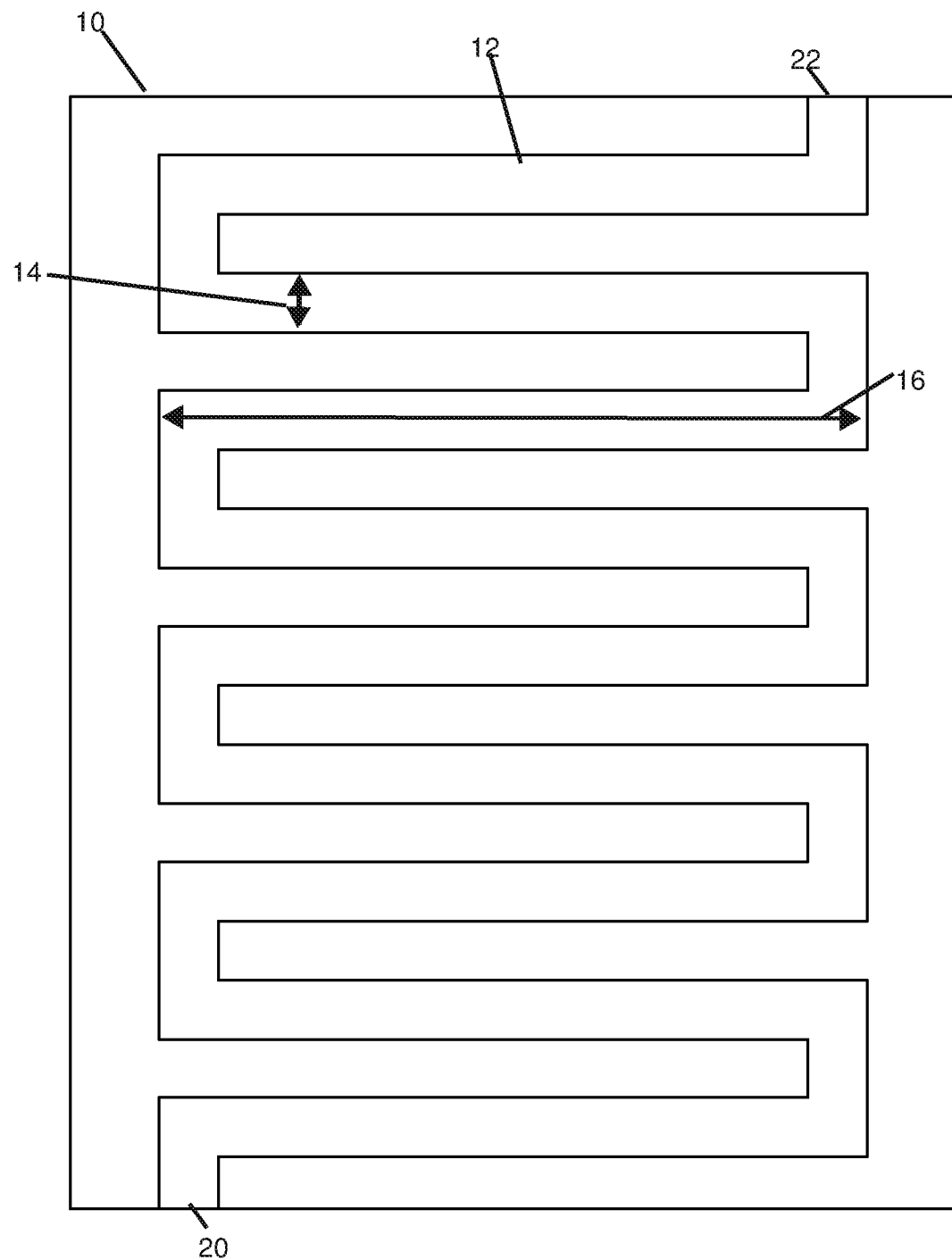
FIG. 1 shows a part of a single frequency channel used in embodiments of the disclosed technology.

Acoustic meta materials (AMM) allow broadband sound to be manipulated on a sub-wavelength scale, that is, on a scale much smaller than the wavelength in air, and from the far field using sub-wavelength acoustic resonators. Because evanescent waves are bound to a source, propagating them to far-field requires them to be converted into propagating waves by lessening their momentum. Such a conversion can be obtained using anisotropic media. However, for such a phenomena to occur and to achieve the required medium, high refractive index material is desired. But for acoustic waves propagating in air, it is difficult to find a natural material with refractive index higher than air. It may be noted that water has a lower refractive index than air.

Sound radiation at low frequencies from a loudspeaker is extremely low due to the smallness of the source size (D) relative to large wavelength (λ) of low frequency sound (D<<λ). The reactive impedance being very high on the loudspeaker diaphragm, energy in propagating waves, which carry sound to far-field, is very little. The evanescent waves dominate at low frequencies. Such evanescent wave stick to their source, their amplitude decreasing exponentially with distance, and are negligible at about a wavelength away from it.

Loudspeakers or speakers convert an electrical impulse into a mechanical impulse which produces sound, usually by way of the use of electromagnetism which moves a cone.

For purposes of this disclosure, a "loudspeaker" is defined as an electro-acoustic transducer, which converts an electrical signal into audio output. Conventional loudspeaker systems have poor bass reproduction if the housings are small. Air compression forces in small housings tend to build up and impede the movement of the radiating loudspeaker's membrane causing the amplitude or quality (harmonics) of the reproduced sound to be noticeably different and noticeably inferior to the original sound according to an ordinary observer.

The loudspeakers, however, are almost always the limiting element on the fidelity of a reproduced sound in either home or theater. Ideally, the loudspeaker systems must, in themselves, be musical instruments of the highest order. The main problem in meeting this objective has been the conversion of the mechanical vibrations of the loudspeaker into sound waves, which closely represent the electrical signal. At low frequencies, in particular, when the speaker cone is moving back and forth slowly, it is incapable of developing sufficient pressure to create sound waves. This applies to all sounds below a certain critical frequency, dependent on the diameter of the cone used. The efficiency of a loudspeaker in creating sound usually is about 0.5%, i.e. 5 E-3.

Impedance in both acoustic and electrical systems consists of two parts. One is purely 'resistive', analogous to an electrical resistor having a resistance in ohms. The other part is purely 'reactive' and it represents the opposition to air flow caused by having to move air masses around or by compressing the air itself. Energy is dissipated or lost in a resistance whereas it is not lost in a reactance.

Sound radiation at low frequencies from a loudspeaker is extremely low due to the smallness of the source size (D) relative to large wavelength (λ) of low frequency sound (D<<λ). At low frequencies, such as 100 Hz, wavelength of sound in air is about 3.42 m. The sound power radiated to far field by a monopole is proportional to $(kD)^2$, where $k=2\pi/\lambda$ and the power decreases proportionally for higher multipoles. For frequencies of interest less than 100 Hz, then $k<1.898$ m$^{-1}$. The acoustic impedance of a loudspeaker cone may be given by:

$$Z=\rho_0 cS[R_1(2ka)+jX_1(2ka)]$$

The resistive part, $R_1$, and the imaginary part, also called reactance. For an average woofer diameter (8 inch) this gives a ka product of less than 0.2. For this value the above equation may be represented as Z sub r is approx. equal to ρ sub 0 times c times S all multipled by (ka)^2 over 2 plus j(8ka/3π).

Since ka is small, the resistive term is negligible and we are left with a purely reactive impedance. Rearranging the variables in the equation, we can have the following: Z sub r is appox. equal to jωρ$_0$S(8a/3π)g.

Since the impedance of a mass is given by Z sub m=jωm.

The radiation impedance at low frequencies is equivalent to adding a mass to the cone of:

$$m_r = \rho_0 S\left(\frac{8a}{3\pi}\right)$$

Note that this approximation is only valid at low frequencies, in the region where we wish to "tune" our enclosures. This approximation is not valid for calculating the frequency response of a loudspeaker over a wide frequency range.

The loudspeaker, which is a generator of acoustic pressure, has an internal (source) acoustic impedance and drives an external load (air) impedance. The air is the ultimate load, and the impedance of air is low, because of its low density. The source impedance of any loud speaker, on the other hand, is high, so there will be a considerable mismatch between the source and the load. Thus, most of the energy being put into a direct radiating loudspeaker will not reach the air, but will be converted to heat in the voice coil and mechanical resistances in the unit. The problem becomes worse at low frequencies, where the size of the source is small compared to a wavelength and the source will merely push the medium away. At higher frequencies, the radiation from the source will be in the form of plane waves that do not spread out. The load, as seen from the driver, is at its highest, and the system is as efficient as it can be.

In the design of musical instruments and speaker enclosures, generally speaking, the only common acoustic transducers previously in use are the pipe, the Helmholtz resonator and the horn. The pipe, reminiscent of the organ pipe, has been used in various forms to load the back wave of a speaker, thus providing additional coupling to ambient air at low frequencies. Such pipes, however, are resonant at fundamental frequency and its odd harmonics.

The bass response of a loudspeaker can be improved by using back radiation. However, the front and back radiation is in anti-phase—and an "acoustic phase inverter" is required for adding the front and back radiation constructively. Loudspeaker enclosures implement the "phase inversion", by coupling front and back radiation from the low frequency unit(s) through an acoustic phase inverting network.

A Helmholtz resonator is simply a box with a port on its front side to couple the enclosed volume of the airspace in the box to the ambient air in the room. The depth of the enclosed airspace in the box behind the port and the width and depth of the port control the resonant frequency of the bass trap. The ported box is basically a Helmholtz resonator (enclosed volume of air with aperture) similar to wind instruments. The resonator generates an artificial bass to represent the lowest notes. These generated notes have a separate tonal quality to the notes above them and are in reverse phase. A woofer diaphragm mounted in a speaker cabinet may boost low frequency radiation, which is not omni-directional and additionally there are requirements of damping sound in the cabinet.

Acoustic horn may be viewed as an acoustic impedance transformer. When a loudspeaker diaphragm vibrates, it creates pressure waves. This is the sound we hear. Coupling the motion of the diaphragm to the air is not an easy thing to do, as the densities of the vibrating diaphragm and the air differ. This is usually called an impedance mismatch. It is known that sound travels better in high-density than in low-density materials, and in a speaker system, the diaphragm is the high-density (high-impedance) medium, and air is the low-density (low-impedance) medium. The horn assists the solid-air impedance transformation by acting as an intermediate transition medium. In other words, it creates higher acoustic impedance for the transducer to work into, thus allowing more power to be transferred to the air. A typical horn is a tube whose cross-section increases exponentially. The narrow end is called the "throat," and the wide end is called the "mouth." The transducer is placed at the throat. When the diaphragm moves near the throat, high pressure occurs with low amplitude in a small area. As the pressure wave moves towards the mouth, pressure decreases and amplitude increases, thus realizing excellent natural and efficient amplification. Horns may have very special properties, including lower distortion and faster transient response than conventional drivers, and they are easier to drive at high SPL's than conventional drivers. However, a loudspeaker mouth connected to a horn improves sound radiation but confines radiation in limited space.

An organ pipe is a sound-producing element of the pipe organ that resonates at a specific pitch when pressurized air (commonly referred to as wind) is driven through it. Each pipe is tuned to a specific note of the musical scale. The sound of a flue pipe is produced with no moving parts, solely from the vibration of air, in the same manner as a recorder or a whistle. The end of the pipe opposite the reed or mouth may be either open or closed (also known as stopped). A closed flue pipe with a uniform cross-section sounds, an octave lower than a similar open pipe of the same length. Also, such an open pipe produces a tone in which both the even-numbered and the odd-numbered partials are present, while a stopped pipe produces a tone with odd-numbered partials.

If a pipe is placed in the sound field generated by a loudspeaker, the pipe will amplify the frequency components that correspond to the eigen-resonances. For organ pipes, the resistive element of impedance determines the amount of sound energy which propagates into the atmosphere beyond the pipe and which we hear as its sound. This variety of resistance is called the 'radiation resistance' against which the pipe has to work. The reactive element represents air movement close to the pipe. This motion does not propagate or dissipate any energy from the pipe; rather the 'reactive' air just moves around locally. During each cycle of oscillation it temporarily stores energy from the pipe and then gives it back again. Energy is drawn from the internal standing wave and emitted in phase at all points across the cross-section of the aperture. Thus, the air in the aperture acts like a piston of the same size, vibrating slightly to and fro as a single entity with a fundamental frequency (pitch) equal to that of the sound produced by the pipe. The piston also vibrates at all the harmonics, which largely determine the timbre or tone color of the pipe. The same piston analogy is used when considering a loudspeaker cone, at least at medium and low frequencies. However unlike a loudspeaker, the piston in a pipe is not made of relatively rigid material of course. Although moving as one entity across the aperture of a pipe, the motion is still one, which comprises nothing but air, having the elasticity and density of the atmosphere, and the use of the word 'piston' does not imply any other substance.

Impedance in both acoustic and electrical systems consists of two parts. One is purely 'resistive', analogous to an electrical resistor having a resistance of so many ohms. The other part is purely 'reactive' and it represents the opposition to air flow caused by having to move air masses around or by compressing the air itself. Energy is dissipated or lost in a resistance whereas it is not lost in a reactance. For organ pipes, the resistive element of impedance determines the amount of sound energy which propagates into the atmosphere beyond the pipe and which we hear as its sound. This variety of resistance is called the 'radiation resistance' against which the pipe has to work. The reactive element represents air movement close to the pipe. This motion does not propagate or dissipate any energy from the pipe; rather the 'reactive' air just moves around locally as described in the next section. During each cycle of oscillation it temporarily stores energy from the pipe and then gives it back again. At low frequencies, such as 100 Hz, wavelength of sound in air is 3.42 m ($\lambda=c/f$, where c is speed of sound and f is frequency), the length of organ pipe needs to be at least equal to quarter of wavelength, i.e., 3.42/4 ($\lambda/4$=0.855 m). This results in a long organ pipe of 0.855 m (or 2.8 ft or 33.66 inch) for 100 Hz.

The pitch of flue instruments, like the flute, organ pipe, or whistle is predominantly controlled by a resonator length L. This length is closely connected to the wavelength $\lambda$=c/f, where c is the speed of sound. Examples of the most common cases are open and stopped organ pipes, commonly characterized by their working length as being half and quarter wavelength, respectively. When such pipes oscillate at their fundamental pitch their internal standing wave patterns of acoustic pressure and flow are classically illustrated this simplified way. When the tube length is less than the wavelength, the amplitude of the sound reproduced or tone can be lost partially or entirely which is a prior art problem to be solved. Standing waves in an organ pipe cause sound pressure is distributed in first, third, and fifth eigen-modes in the pipe. The resonant sound radiation has 100% efficiency in radiating sound (discounting mechanical losses). However, due to their large length/size, such long organ pipes are not suitable for enhancing low frequency sound of loudspeakers.

Thus, when pipes are shorter than the wavelength propagated, the sound is not reproduced properly. When the pipes are longer than the wave-length propagated, the sound can not only be reproduced but the eigen-modes can also be reproduced. An eigenmode is a natural vibration of a system such that various parts all move together at the same frequency. The different parts all move sinusoidally at the same frequency and their amplitudes all increase or decrease in proportion to one another. There can be phase differences for different parts of the system. For example, as will be shown below, to properly represent a low A at 55 Hertz one would need a 1.564 meter pipe. For practical reasons, in room speaker or a phone speaker, this is not ordinarily possible. Phone speakers are typically measured on an order of magnitude of millimeters.

Refraction is a phenomenon that often occurs when waves travel from a medium with a given refractive index to a medium with another at an oblique angle. At the boundary between the media, the wave's phase velocity is altered, usually causing a change in direction. Its wavelength increases or decreases, but its frequency remains constant. Refractive index is defined as the factor by which the wavelength and the velocity of the propagating wave are reduced in the medium as it passes through with respect to their vacuum values. Refraction occurs because of a change of speed of propagation of the wave. When light passes from air to water it slows down, whereas when sound travels from air to water it speeds up. Therefore sound is refracted away from the normal, whereas light is refracted towards the normal. The speed of sound is greater in water than in air, so the wavelength in water is greater than in air. In effect the refractive index of the water is less than the refractive index of the air. Snell's Law describes the relationship between the angles and the velocities of the waves. Snell's law equates the ratio of material velocities $V_1$ and $V_2$ to the ratio of the sine's of incident ($Q_1$) and refracted ($Q_2$) angles, as shown by an equation of a first sin of theta divided by a second sin of theta equals $V_{L1}$ divided by $V_{L2}$ which equals n2 divided by n1.

Where:

$V_{L1}$ is the longitudinal wave velocity in material 1, VU is the longitudinal wave velocity in material 2, and $n_1$ $n_1$ and $n_2$ are refractive indices of the two mediums.

For miniature acoustic devices, higher refractive index acoustic mediums are desired to slow down the speed of sound waves. For acoustic waves propagating in air, however, it is difficult to find a natural material with acoustic refractive index higher than that of air. In acoustics, slow sound is a relatively new concept and a remarkable matter with potential applications to audio systems. Acoustic meta materials offer a way to design acoustic materials with high refractive index and corresponding slow sound speed. Broadband audible range sound can be manipulated and focused on a sub-wavelength scale, that is, on a scale much smaller than the wavelength in air, and from the far field using sub-wavelength acoustic resonators. For this purpose, a collection of simple, miniature sub wavelength resonator pipes is used in the present invention.

Acoustic meta materials are defined as engineered structures that exhibit unusual effective material properties such as density, bulk modulus, and refractive index with negative, zero or highly anisotropic values (having a physical property that has a different value when measured in different directions). In meta materials with high refractive index, acoustic waves are forced to travel in a narrow channel system thereby increasing the total propagation time and therefore leading to a low sound velocity and a high refractive index. The propagating phase along these winding sub-channels can be arbitrarily delayed in order to mimic high refraction index.

Figure 3:
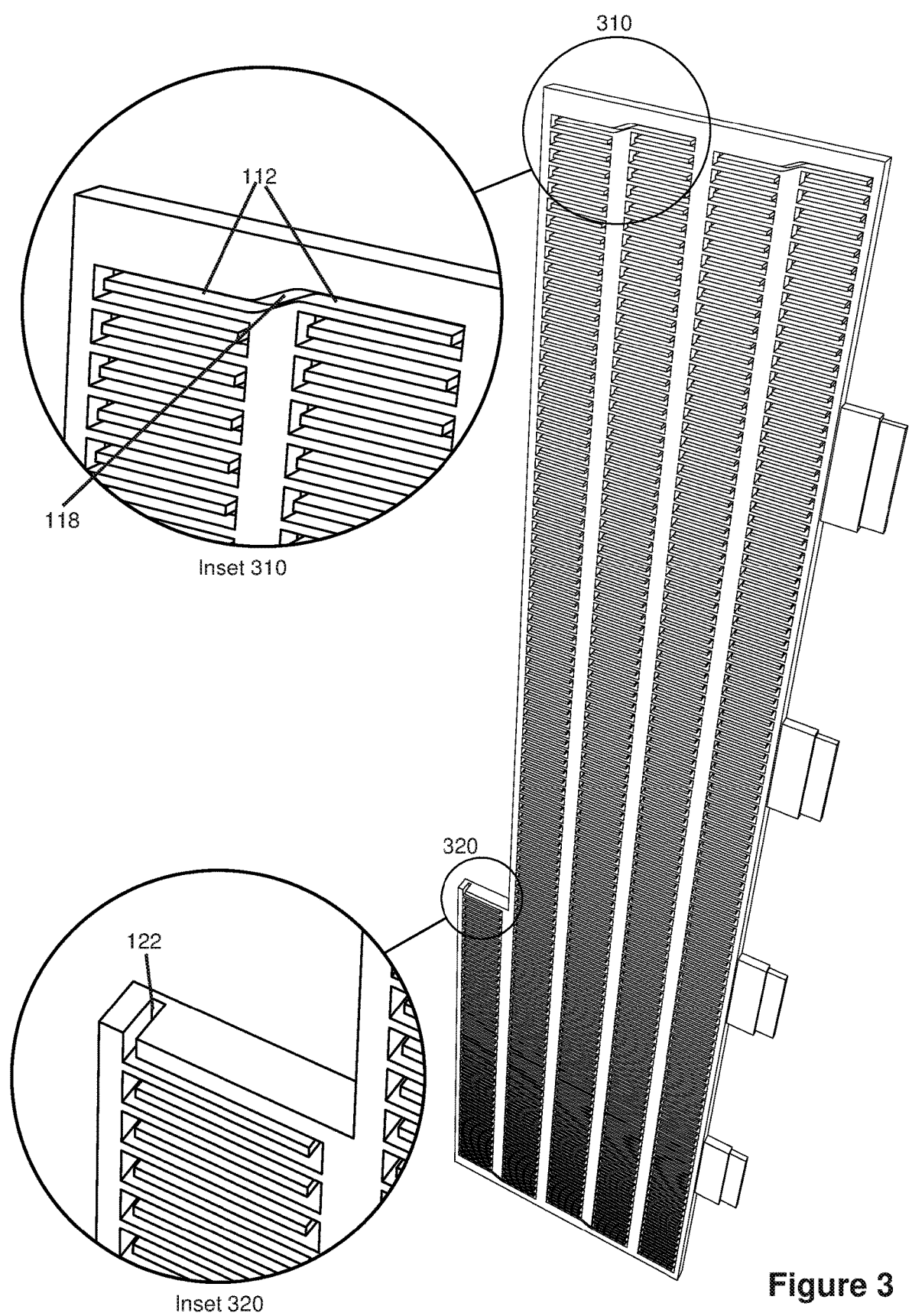
FIG. 3 shows a zig-zag "maze" of a channel having a length greater than a housing in which it is held, in an embodiment of the disclosed technology.

FIG. 1 shows a part of a single frequency channel used in embodiments of the disclosed technology. This channel is an anisotropic system with a high refractive index medium (where sound passes through the pathway cut into the device 10 at a ratio of at least 100:1 compared to passage through the solid medium) used in an embodiment of the disclosed technology. A zig-zag pattern of the channel has a total length equal to that of a ¼, ½, or the wavelength of the frequency to propagated there-through. Therefore, in an example where FIG. 3 represents a channel for 100 Hz sound waves the channel is a length of 3.42 m (from end to end through the zig-zag pattern) or 0.855 m long which represents ¼ of the wavelength for a 100 Hz vibration.

In the channel shown (FIG. 1), which is an example of a part of a channel for a single frequency, such as 100 Hertz, the channel has an opening 20 where sound enters after being emanated from a speaker. The total length of the pathway 12 from the intake opening 20 to the exit 22 is equal to that of the wavelength, which it amplifies via passive and acoustic resonance. In the 100 Hz example (FIG. 3), the length of passageway 12 is 3.42 meters, ½, or ¼ this amount. A width of each "zig" or "zag" is given by numeral 16 and the height is given by numeral 14. Both the height and width of the channel 12 can be said to be "narrow" or "small" which is defined as "less than 3 mm." This is an important novel feature of the disclosed technology because until recently it was not possible to implement a closed channel of this length and small size for low frequencies.

Different channels for each of a plurality of different frequencies are used to enhance low frequency sound of various sources by enclosing the sound source in a sub-wavelength acoustic meta material amplifier device. A novel anisotropic meta material that can effectively trap the broad-band acoustic waves and spatially split different frequency components is thus disclosed. Due to the high refractive-index of such meta materials, the size of this device is much more compact than previous designs without using sub-wavelength units. Instead of, in the 100 Hz example, having an organ pipe of about 0.855 meters long, which is impractical in a home sound system or phone, a design using sub wavelength resonator with an overall length less than 10 cm can be constructed.

Figure 2:
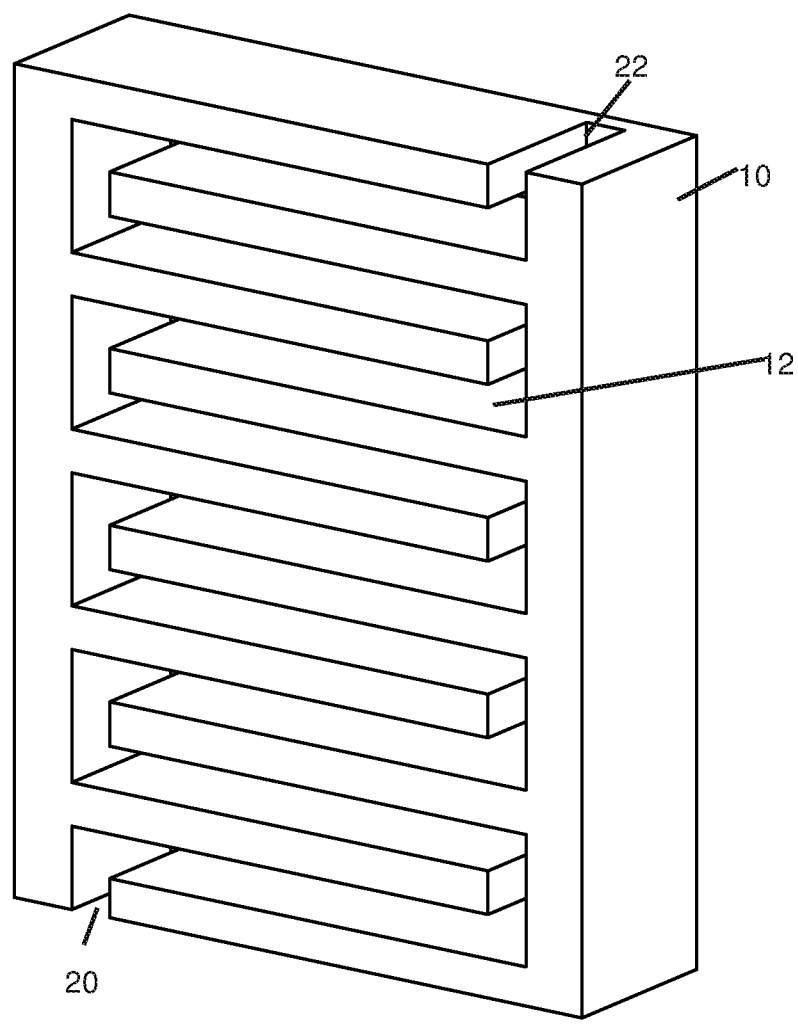
FIG. 2 shows a perspective view of a part of a single channel of embodiments of the disclosed technology.

FIG. 2 shows a perspective view of a part of a single channel of embodiments of the disclosed technology. The two-dimensional sketch of an acoustic meta material channel to realize high refractive index, which is composed of a periodic array of sub-channel units attached to an air waveguide at the base with incoming acoustic signal, is shown in FIG. 2. The sub-wavelength channel tuned to a particular frequency represents the miniaturized version of an organ pipe. Although, the number of channels required in a housing (see FIG. 4), to achieve high refractive index can be large at low frequencies, the AMM amplifier can still be compact. The number of sub (or zig zag)-channels in a single channel depends on the total distance travelled by sound waves. Since sound waves are forced to travel inside sub-channels for the required distance, which can be quarter of a wavelength or more, their speed reduces. There can be several channels stacked together (side-by-side) with each channel tuned to a different frequency.

The refractive index of each channel, depends on dimensions of the channel and total distance sound waves will travel. Acoustic pressure waves can propagate freely in the air channel without a cut-off frequency due to the longitudinal property of acoustic waves. It may be mentioned that sound waves in air (and any fluid medium) are longitudinal waves because particles of the medium through which the sound is transported vibrate parallel to the direction that the sound wave moves. Sound moving through air compresses and rarefies the gas in the direction of travel of the sound wave as they vibrate back and forth. In other words, low frequency acoustic waves approximately travel along the zig-zag path, as shown in FIG. 3, denoted by the arrow inside the sub-channel. The effective refractive index is relatively high, since the propagation time from the inlet to top outlet is delayed/increased by coiling up the channel in space.

The sound wave, in embodiments of the disclosed technology, traverses a distance of quarter-wavelength (e.g., $\lambda/4$) at the corresponding frequency. For example, the quarter wave length distance at 32.703 Hz is about 2.629 m (see FIG. 7). In this scenario, t is feasible to fold (or U-turn) the channel multiple times to fit it into a short length as shown in FIG. 3.

FIG. 3 shows a zig-zag "maze" of a channel having a length greater than a housing in which it is held, in an embodiment of the disclosed technology. The device shown in FIG. 3 represents a single channel winding up and down into five columns. In inset 310 it can be seen that the top of two columns join a channel 122 at a crossover part of the channel 118. In inset 320 one can see the single exit opening 122 where sound, after resonating through a channel of multiple meters in length, exits amplified in magnitude. The factor by which the detour elongates the geometrical path length can be interpreted as an effective phase refractive index. For frequencies below the first-order Bragg resonance condition, negligible effective dispersion is expected and, hence, phase and group velocity of sound are frequency-independent and identical.

The resonance frequency of an open-open channel occurs at the frequency f=nc/2L (where L is the total distance travelled by sound, c is speed of sound, and n is an integer), whereas for open-closed pipe it occurs at nc/4L. A simple notion is that the fundamental resonance of a pipe occurs when the sound wavelength is half or a quarter of the resonator length, based on whether it is open-open or open-closed configuration. For sub-wavelength design of low frequency resonators, an open-close configuration is selected. The refraction index of a channel is dependent on the dimensions of zigzag sub channels within the channel shown.

Although sub-wavelength channels can be tuned to any desired frequencies, in some embodiments, it is desired and advantageous to tune the channels (meaning, have a length of the channels) to frequencies corresponding to musical notes as shown in FIG. 7, by way of an example of an octave of frequencies in a chromatic scale. The selected frequencies and notes represent the lowest octave of musical notes and provide the baseline frequencies for channels. The length of each channel needs to be close to quarter wavelength at the tuning frequency, (i.e., lower frequencies covering bass and sub-bass frequencies in the frequency range of 30-200 Hz). All channels provide fundamental and higher harmonics to cover broadband frequency range (e.g., 30-10000 Hz). Another advantage of selecting musical notes is that their higher harmonics fall on frequencies of musical notes in higher octaves. Since music, whether vocal or instrumental, is created using these basic notes, the enhancement of sound at these frequencies will not introduce distortion in the music and will enhance sound at these frequencies and their higher harmonics.

The musical intervals or notes selected, is a unique feature of the amplifier embodiment. These musical notes actually reflect the sounds of human speech, and are hidden in the vowels we use. Musical scales sound right because they match the frequency ratios that our brains are primed to detect. Although it is preferable to select the first seven notes in combination with the next five notes as they complete one octave, it may be sometimes satisfactory to select the first seven notes if there is not sufficient space.

Figure 6:
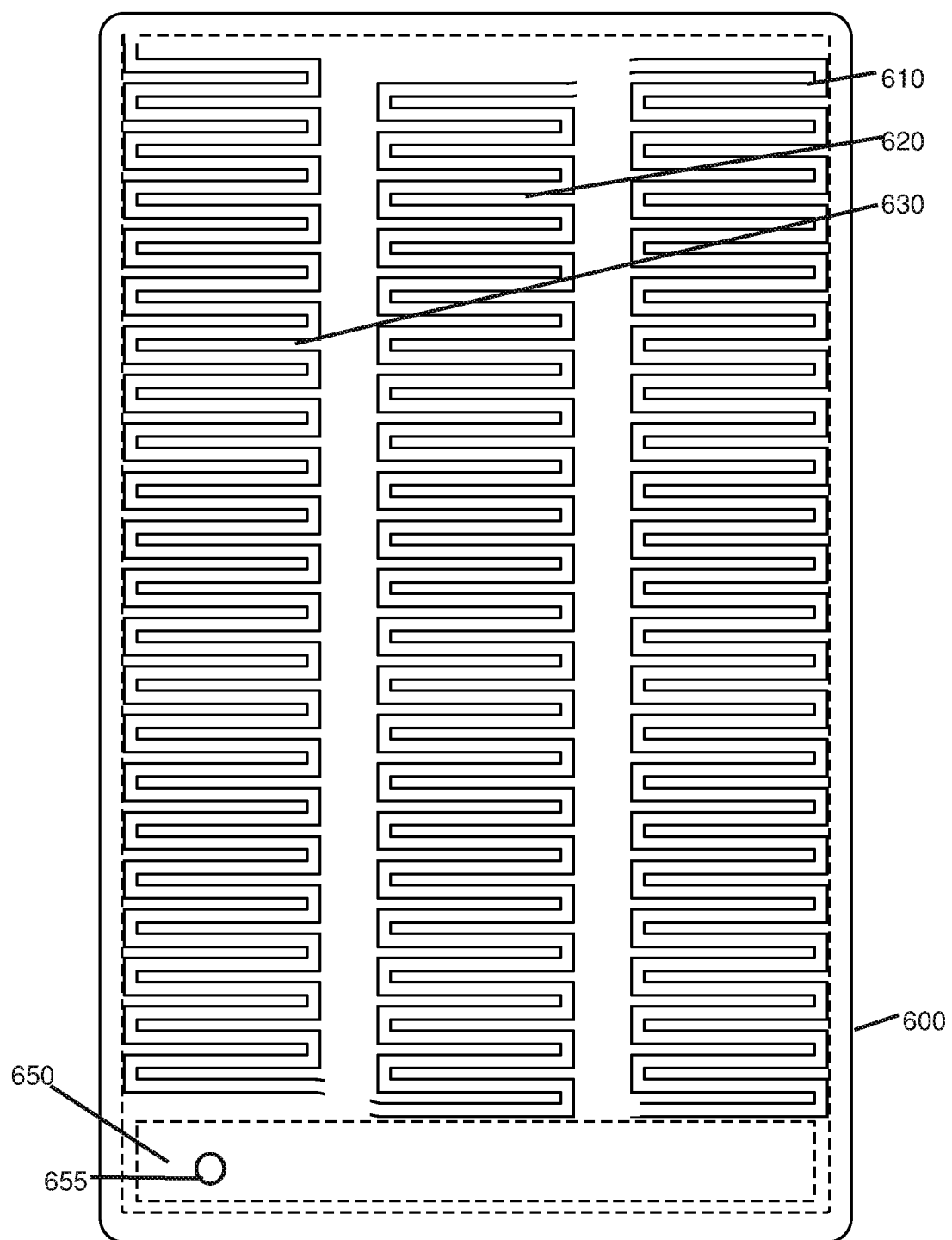
FIG. 6 shows multiple channels attached to a back of a hand-held electronic device.

Skipping to FIG. 6, FIG. 6 shows multiple channels attached to a back of a hand-held electronic device. The channels can be located inside or outside of the device, such as in a case. The figure represents both embodiments. The phone device 600, which has cellular network connectivity, a display screen, a speaker, and a microphone in embodiments of the disclosed technology, can have multiple channels. For the sake of clarity, only three are shown, channels 610, 620, and 630. These channels can be connected to a unitary housing, such that the numeral 600 might represent a phone case or the like which has an opening over a speaker 655 built into the device. A narrow waveguide region 650 may cause he sound to pass into the openings for each channel 610, 620, and 630.

Figure 4:
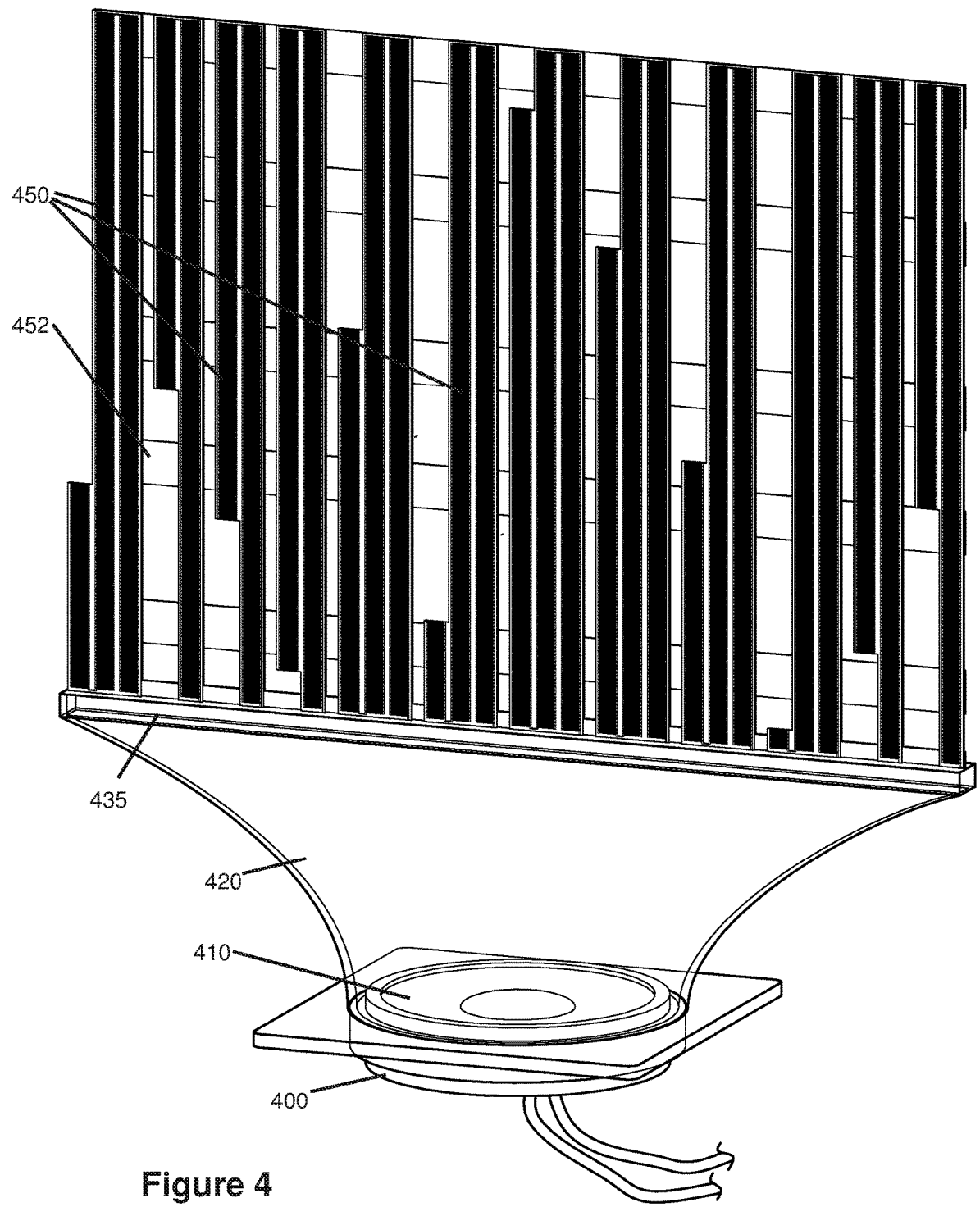
FIG. 4 shows multiple channels arranged in a path of sound emanating from a speaker and being funneled thereto, in an embodiment of the disclosed technology.
Figure 5:
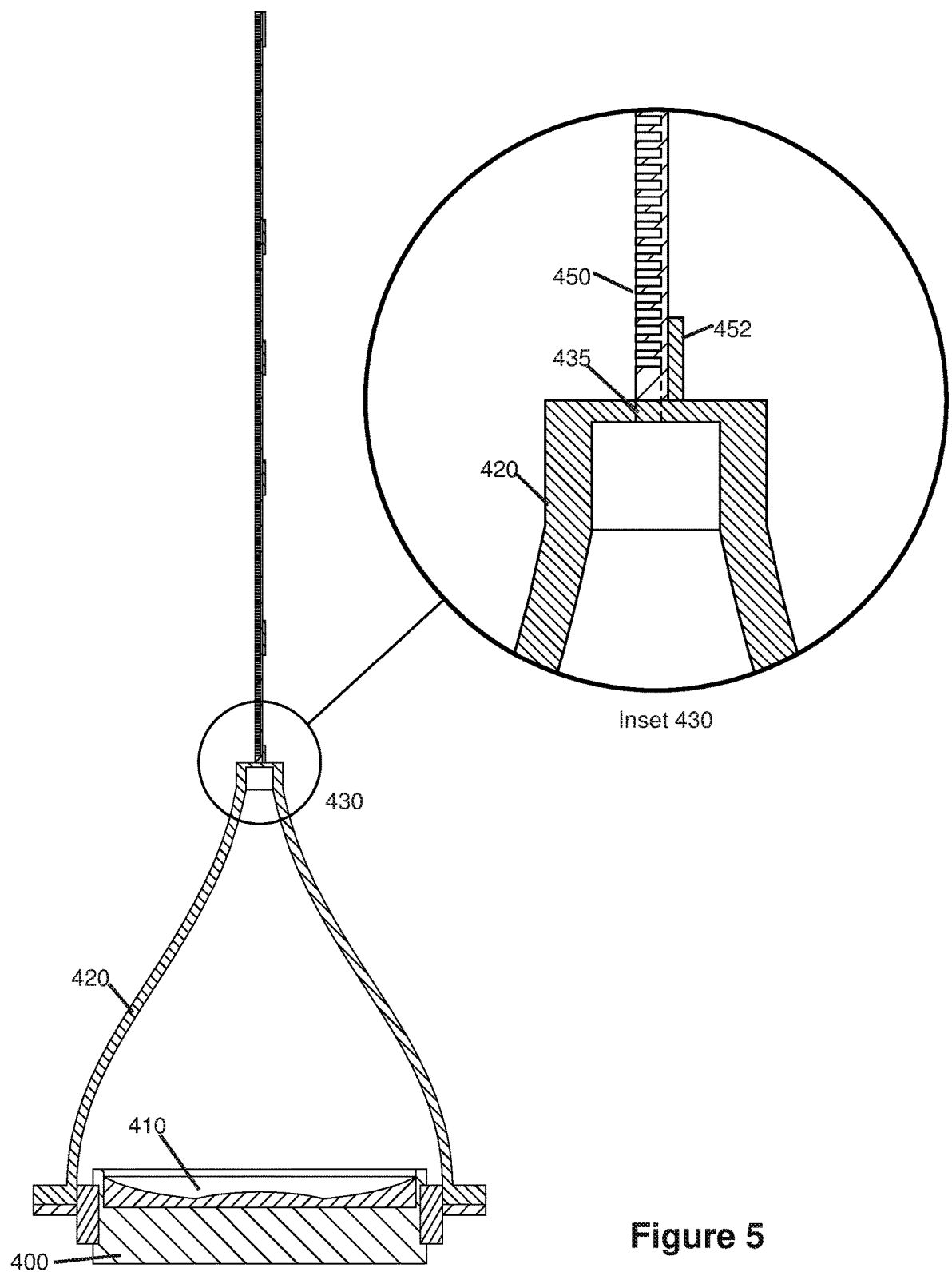
FIG. 5 shows a side-view of the embodiment shown in FIG. 4.

FIG. 4 shows multiple channels arranged in a path of sound emanating from a speaker and being funneled thereto, in an embodiment of the disclosed technology. FIG. 5 shows a side-view of the embodiment shown in FIG. 4. Here, a traditional or standard speaker 400 which converts electrical impulses into magnetic movements of a speaker cone generates sound waves which are transmitted through a cover 410 away from the speaker and into a funnel or cone 420 which, in this embodiment, is circular at the end nearest the speaker and flattens into an elongated rectangle at the end nearest the channels. The top rectangular side, a waveguide, 435 interfaces with and causes sound to flow substantially completely in one vector direction, in this case, towards the top of the page. A back plane 452 holds the channels 450 in place such that their respective openings to receive sound waves/vibrations face towards the direction of sound travel from the speaker 400 through the rectangular interface 435. Each channel has a different total length of a passageway there-in and resonates at a different frequency.

The wavelength of lower/bass frequencies is less and is typically unable to be produced well with a small speaker, such as that used in a handheld electronic device. Here, the shorter channels (10 centimeters and less) is an asset as such channels can be made to fit in a small space. The entire apparatus shown can be less than 20 or 30 centimeters from speaker 400 to a top edge of the channels 450. The AMM device comprising of channels may resemble a thin (2-3 mm) sheet, which allows it to be fitted to any audio speaker or mobile phone.

An assembly of such AMM sub wavelength resonators not only amplifies sound at their fundamental frequencies but also produces multiple harmonics of bass frequencies, thus covering a broadband frequency range.

Figure 8:
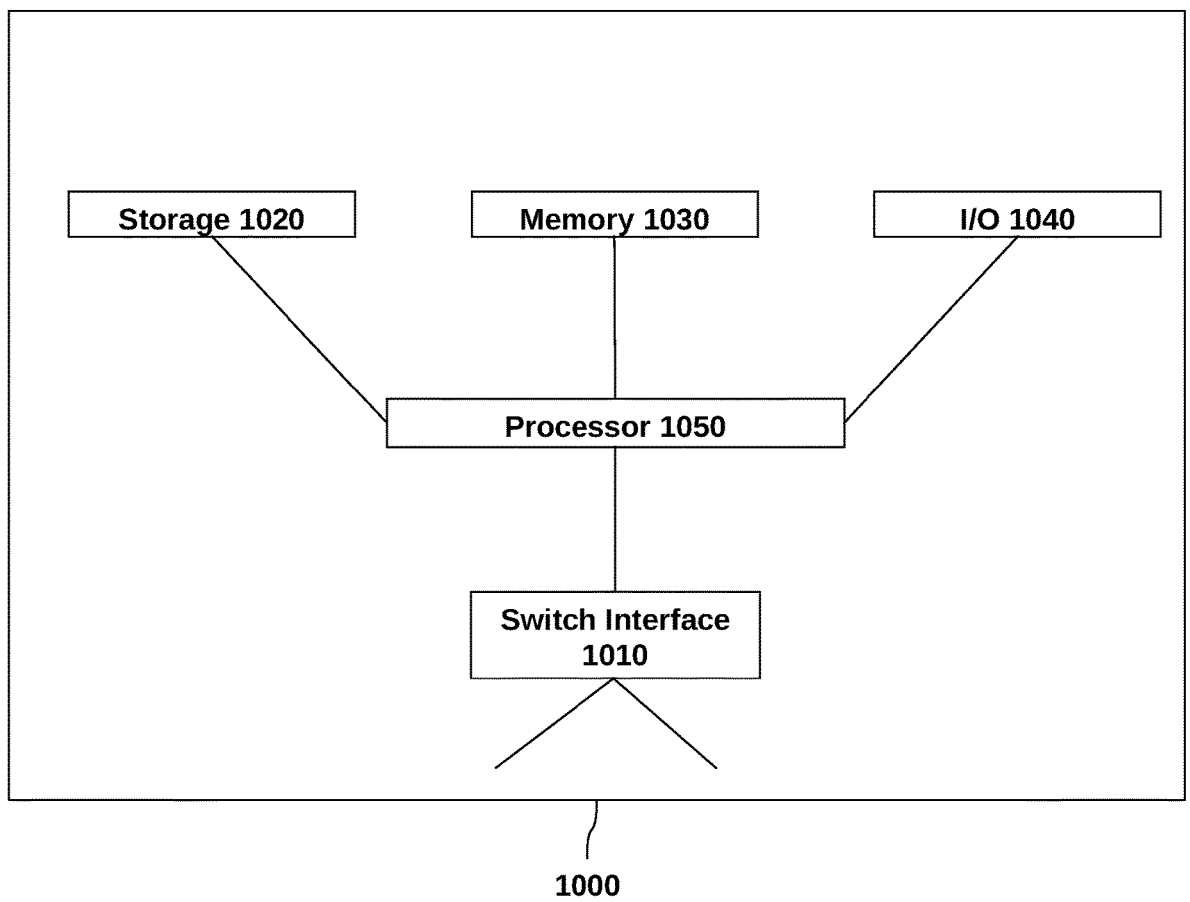
FIG. 8 is a high level block diagram showing devices on which embodiments of the disclosed technology may be carried out.

FIG. 8 shows a high-level block diagram of a device that may be used to carry out the disclosed technology. Device 1000 comprises a processor 1050 that controls the overall operation of the computer by executing the device's program instructions which define such operation. The device's program instructions may be stored in a storage device 1020 (e.g., magnetic disk, database) and loaded into memory 1030, when execution of the console's program instructions is desired. Thus, the device's operation will be defined by the device's program instructions stored in memory 1030 and/or storage 1020, and the console will be controlled by processor 1050 executing the console's program instructions. A device 600 also includes one, or a plurality of, input network interfaces for communicating with other devices via a network (e.g., the Internet). The device 1000 further includes an electrical input interface. A device 1000 also includes one or more output network interfaces 1010 for communicating with other devices. Device 1000 also includes input/output 1040, representing devices which allow for user interaction with a computer (e.g., display, keyboard, mouse, speakers, buttons, etc.). One skilled in the art will recognize that an implementation of an actual device will contain other components as well, and that FIG. 8 is a high level representation of some of the components of such a device, for illustrative purposes. It should also be understood by one skilled in the art that the method and devices depicted in FIGS. 1 through 6 may be implemented on a device such as is shown in FIG. 8.

Further, it should be understood that all subject matter disclosed herein is directed, and should be read, only on statutory, non-abstract subject matter. All terminology should be read to include only the portions of the definitions which may be claimed. By way of example, "computer readable storage medium" is understood to be defined as only non-transitory storage media.

While the disclosed technology has been taught with specific reference to the above embodiments, a person having ordinary skill in the art will recognize that changes can be made in form and detail without departing from the spirit and the scope of the disclosed technology. The described embodiments are to be considered in all respects only as illustrative and not restrictive. All changes that come within the meaning and range of equivalency of the claims are to be embraced within their scope. Combinations of any of the methods and apparatuses described hereinabove are also contemplated and within the scope of the invention.

The invention claimed is:

1. A method of passively amplifying acoustic output of a speaker over a broad frequency range, comprising:
   aligning an opening into a plurality of single frequency channels towards a conventional loudspeaker; and
   outputting sound through said conventional speaker substantially in a direction of each said opening;
   wherein each said single frequency channel is in a zig-zag pattern with a unique length compared to each other said single frequency channel;
   wherein said unique length is in a ratio of 1/4, 1/2, or that of a wavelength being amplified and each single frequency channel is a different note in an octave; and
   wherein at least a majority of each said single frequency channel has a total length of, 1/2 length of, and/or 1/4 length of each Helmholtz musical note in a bass musical range.

2. The method of claim 1, wherein said plurality of single frequency channels include at least some channels which extend vertically, in said zig-zag pattern, before turning and continuing in an opposite direction continuing in said zig-zag pattern;
   wherein a zig-zag pattern is one which extends one direction and then turn and extend an opposite direction at least 10 times.

3. A method of passively amplifying acoustic output of a speaker over a broad frequency range, comprising:
   aligning an opening into a plurality of single frequency channels towards a conventional loudspeaker; and
   outputting sound through said conventional speaker substantially in a direction of each said opening;
   wherein each said single frequency channel is in a zig-zag pattern with a unique length compared to each other said single frequency channel;
   wherein said unique length is in a ratio of 1/4, 1/2, or that of a wavelength being amplified and each single frequency channel is a different note in an octave; and
   wherein said plurality of single frequency channels are fixedly attached in an array to a unitary housing, each said plurality of single frequency channels with a respective said opening oriented to curve sound towards a direction of sound travel from said conventional speaker.

4. The method of claim 3, wherein said conventional speaker is an internal speaker of an electronic device and said unitary housing covers substantially a side of said electronic device.

5. The method of claim 4, wherein said electronic device comprises a cellular phone network transceiver, a display, said conventional speaker, and a microphone.

6. An array of passive single frequency channels comprised of:
   a plurality of individual frequency channels each having a sound intake opening in a common direction or substantially common direction;
   each individual frequency channel extending in a zig-zag pattern having a different total length from a respective said sound intake opening until a sound exit;
   a conventional speaker outputting sound towards said common direction;
   wherein each said individual frequency channel amplifies sound at, at least one different frequency from each other said individual frequency channel; and
   wherein a majority of said individual frequency channels have a total length equal to, one half of, and/or one quarter of a musical note defined in the Helmholtz pitch notation system.

\* \* \* \* \*